(12) United States Patent
Temes et al.

(10) Patent No.: US 7,046,046 B2
(45) Date of Patent: May 16, 2006

(54) SWITCHED CAPACITOR SIGNAL SCALING CIRCUIT

(75) Inventors: Gabor C. Temes, Corvallis, OR (US); Janos Markus, Budapest (HU); Jose Silva, Corvallis, OR (US)

(73) Assignee: Microchip Technology Incorporated, Chandler, AZ (US)

( * ) Notice: Subject to any disclaimer, the term of this patent is extended or adjusted under 35 U.S.C. 154(b) by 72 days.

(21) Appl. No.: 10/806,598

(22) Filed: Mar. 23, 2004

(65) Prior Publication Data
US 2005/0212591 A1   Sep. 29, 2005

(51) Int. Cl.
   *H03M 1/12*   (2006.01)
(52) U.S. Cl. .......................... 327/91; 341/172; 341/143
(58) Field of Classification Search .................. 327/94, 327/90–91; 341/125, 143, 155, 150, 161, 341/172
   See application file for complete search history.

(56) References Cited
U.S. PATENT DOCUMENTS

| | | | |
|---|---|---|---|
| 4,851,841 A | 7/1989 | Sooch | 341/143 |
| 5,729,232 A | 3/1998 | Fujimori | 341/172 |
| 5,990,819 A * | 11/1999 | Fujimori | 341/150 |
| 6,037,887 A | 3/2000 | Wu et al. | 341/143 |
| 6,140,950 A | 10/2000 | Oprescu | 341/143 |
| 6,147,522 A | 11/2000 | Rhode et al. | 327/93 |
| 6,433,712 B1 | 8/2002 | Ohnhaeuser et al. | 341/118 |
| 6,967,611 B1 * | 11/2005 | Atriss et al. | 341/172 |
| 6,972,705 B1 * | 12/2005 | Fei et al. | 341/143 |

* cited by examiner

*Primary Examiner*—Dinh T. Le
(74) *Attorney, Agent, or Firm*—Baker Botts L.L.P.

(57) ABSTRACT

A signal scaling circuit for accurately reducing the effective amplitude of an input signal by a rational factor N/M, where N and M are integers and N<M, is disclosed. An input, reference, bias and output node as well as control circuitry are selectively coupled to M switched capacitor circuits such that N/M scaling may be achieved. Cooperation between the M switched capacitor circuits and the control circuitry divides the M switched capacitors circuits into subsets of N and M−N switched capacitors, respectively. Each subset is then selectively coupled to an input, reference and/or bias signal to produce an output signal having as one of its components an N/M portion of the input signal. Error reduction in the scaled signal is achieved by shuffling the switched capacitor circuits populating each subset after selected time intervals.

12 Claims, 2 Drawing Sheets

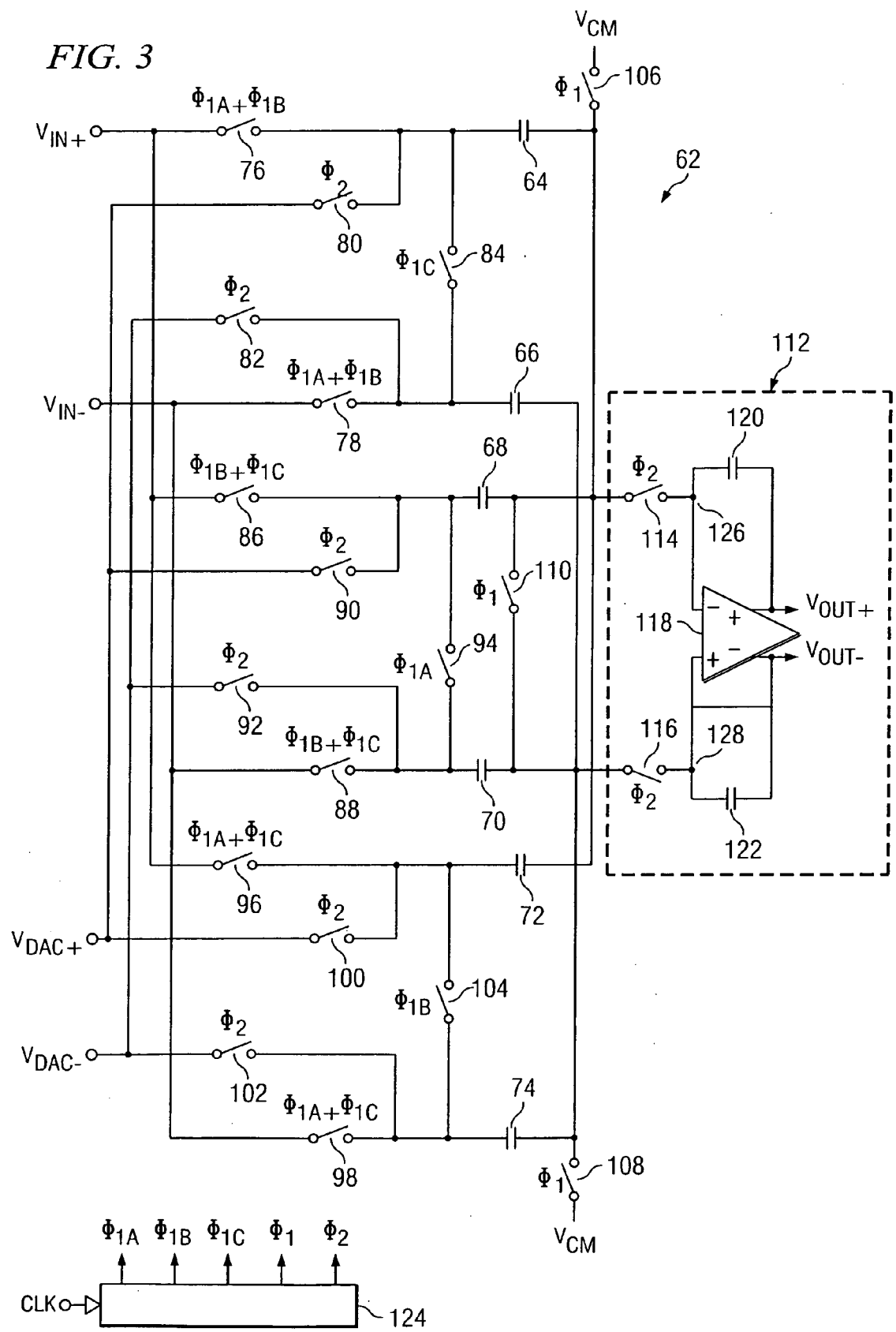

SWITCHED CAPACITOR SIGNAL SCALING CIRCUIT

FIELD OF THE INVENTION

The present invention relates generally to signal processing and, more particularly, to the accurate scaling of signals for use in signal processing applications.

BACKGROUND OF THE INVENTION TECHNOLOGY

Oversampling A/D (analog-to-digital) converters sample analog input signals at a rate $Df_s$, where $f_s$ is approximately twice the bandwidth of the filtered analog input signal and D is an integer multiplier. $Df_s$ exceeds twice the bandwidth of the analog input signal. Oversampling converter configurations typically include an anti-alias filter, a sampler and modulator (quantizer) operating at the elevated sampling rate $Df_s$, and a digital filter. The digital filter, commonly called a decimator, generally provides low-pass filtering to suppress signals above $f_s/2$, and a sample-rate reduction to lower the sample rate to the desired rate $f_s$. One consequence of higher input sampling rates is that oversampling converters typically have less stringent anti-alias filter requirements than traditional converters. In addition, oversampling converters permit lower quantization noise power in the signal band, and hence improved signal-to-noise ratio compared to traditional converters.

A/D converters typically operate over a specified maximum and minimum input signal range. The maximum input signal may be referred to as the converter's full-scale input value. Under optimal operating conditions, if a full-scale input is applied to the converter, the converter will generally provide a full-scale output. In reality, however, the converter's actual output typically differs from the ideal result. The difference between the actual output and the ideal output is known as the full-scale error. An accurate full-scale converter has very small full-scale error.

An accurate full-scale oversampling converter has significant practical importance in such fields as data acquisition, test and measurement instrumentation, industrial control, etc. Accurate full-scale oversampling converters are preferred because they typically provide an accurate conversion result, exceptional unwanted signal rejection capabilities and have simplified anti-alias requirements.

A delta-sigma (DS) modulator generates a digital output signal whose DC average is generally a good estimate of a DC or low-frequency input signal $V_{IN}$, divided by a reference voltage $V_{REF}$. Nominally, A/D conversion can be performed in the range $-V_{REF} < V_{IN} < +V_{REF}$. However, conversion accuracy generally deteriorates when the input signal $V_{IN}$ approaches $-V_{REF}$ or $+V_{REF}$. As a result, one step towards designing accurate full-scale oversampling converters and other digital signal processing components involves obtaining controllable and accurate reduction in the amplitude of $V_{IN}$. U.S. Pat. No. 6,140,950 depicts a delta-sigma (DS) modulator that requires N+M switched capacitors for scaling an input voltage by N/M.

SUMMARY OF THE INVENTION

In accordance with teachings of the present invention, a signal scaling circuit having a plurality of M switched capacitor circuits operably coupled together is provided. In a preferred embodiment, the M switched capacitor circuits are operable to receive a signal from an input source, a reference source and a bias source and further operable to communicate an output signal to an output circuit. The M switched capacitor circuits are preferably responsive to control circuitry where the control circuitry selectively couples the M switched capacitor circuits to the input source, reference source and bias source such that the output signal communicated to the output circuit includes a N/M times scaled version of the input signal, where N is a positive integer smaller than M. Unlike U.S. Pat. No. 6,140,950 which requires N+M switched capacitors to scale an input voltage by N/M, the present invention only requires M switched capacitors to scale an input voltage by N/M.

In an alternate embodiment, the present invention discloses a circuit for generating at an output node an output signal including a scale factor N/M times an input signal. The circuit preferably includes an input signal node operable to receive the input signal from an input signal source, a reference signal node operable to receive a reference signal from a reference signal source and a bias node operable to receive a bias signal from a bias signal source. A plurality of M switched capacitor circuits are also preferably provided and may be selectively coupled to the input signal node, reference signal node, bias signal node and output node by associated control circuitry. The control circuitry and the M switched capacitor circuits cooperate to create a first subset of N switched capacitor circuits and a second subset of M−N switched capacitor circuits. The M switched capacitor circuits and the control circuitry further cooperate such that the N switched capacitor circuits selectively sample the reference signal and the input signal and the M−N switched capacitor circuits selectively sample the reference signal to produce an output signal at the output node including a scale factor N/M times the input signal.

In a further embodiment, the present invention provides a signal scaling circuit including a plurality of M switched capacitor circuits operably coupled to an input node, a reference node, a bias node and an output node operable to communicate an output signal to an output circuit. The input node, reference node and bias nodes are operable to receive an input signal, a reference signal and a bias signal, respectively. Each of the M switched capacitor circuits preferably has a substantially equivalent capacitance C/M, where C is the total capacitance of the M switched capacitor circuits. Control circuitry operably coupled to the M switched capacitor circuits is also preferably included and is operable to divide the M switched capacitor circuits into a subset of N switched capacitor circuits and a subset of M−N switched capacitor circuits. The control circuitry directs each of the N switched capacitor circuits to deliver a charge signal approximating (C/M)(reference signal-input signal) and each of the M−N switched capacitor circuits to deliver a charge signal approximating (C/M)(reference signal) to the output node.

In yet another embodiment, the present invention provides a method of scaling an input signal from a set of M switched capacitor circuits. The method preferably includes selectively coupling a first and a second subset of the switched capacitor circuits to an input source, a reference source and a bias source. The method preferably also includes communicating an output signal including a scale factor N/M times the input signal to an output node in each clock cycle.

In one aspect, the present invention provides the technical advantage of accurately and controllably scaling an input signal by a rational factor N/M, where N<M, using M switched capacitor circuits.

In another aspect, the present invention provides the technical advantage of operability within a variety of applications and in association with timing and control circuitry included therewith.

In a further aspect, the present invention provides the technical advantage of minimizing the error generally associated with signal scaling and sampling circuits by shuffling the members of the signal sampling subsets.

Additional features and advantages of the present invention will be apparent from the following description of the embodiments, given for the purpose of disclosure and taken in conjunction with the accompanying drawings.

BRIEF DESCRIPTION OF THE DRAWINGS

A more complete understanding of the present disclosure and advantages thereof may be acquired by referring to the following description taken in conjunction with the accompanying drawings, wherein:

FIG. 3 is a schematic diagram depicting an exemplary embodiment of a differential switched capacitor signal scaling circuit according to teachings of the present invention.

Figure 1:
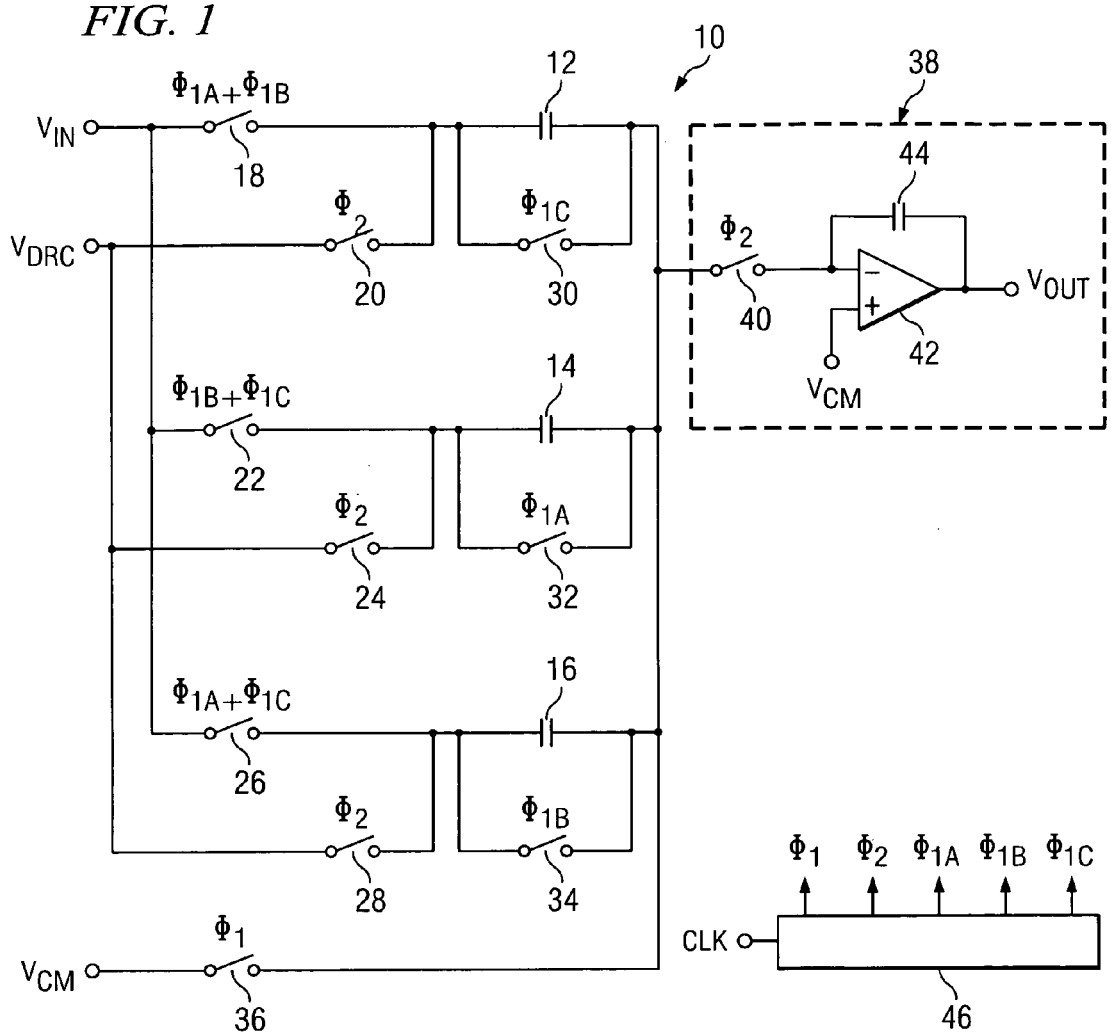
FIG. 1 is a schematic diagram depicting an exemplary embodiment of a single-ended switched capacitor signal scaling circuit according to teachings of the present invention.

While the present invention is susceptible to various modifications and alternative forms, specific exemplary embodiments thereof have been shown by way of example in the drawings and are herein described. It should be understood, however, that the description herein of specific embodiments is not intended to limit the invention to the particular forms disclosed. Instead, the intention of the present disclosure is to cover all modifications, equivalents, and alternatives falling within the spirit and scope of the invention as defined by the appended claims.

DETAILED DESCRIPTION OF SPECIFIC EMBODIMENTS

Figure 2:
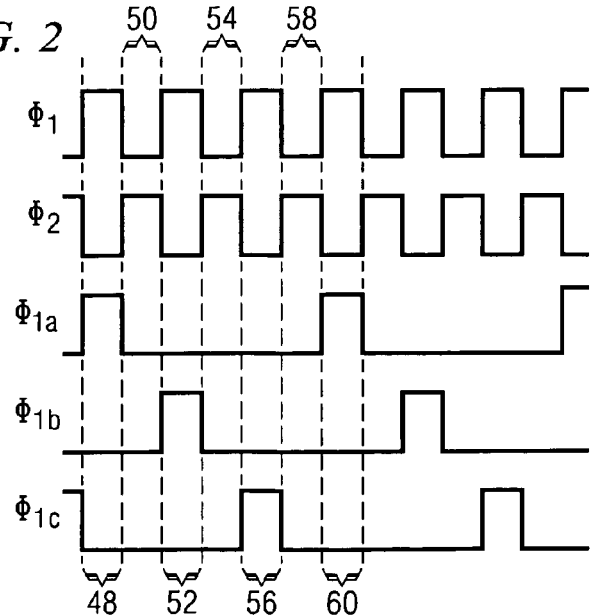
FIG. 2 is a timing diagram illustrating control circuitry signaling for use with the switched capacitor signal scaling circuit illustrated in FIG. 1 according to teachings of the present invention.

Referring to the following discussion and FIGS. 1 through 3, the details of exemplary embodiments of the present invention are illustrated. Like elements in the drawings are represented by like numbers.

In one aspect, a principle of the present invention is to employ M switched capacitor circuits, each with nominal capacitance C/M, to achieve desired signal scaling. Using control circuitry and the switches included in each switched capacitor circuit, the M switched capacitor circuits may be divided into two groups or subsets. A first division of the M switched capacitor circuits will preferably yield a group or subset of N switched capacitor circuits and a second group or subset will preferably contain the remaining M–N switched capacitor circuits.

In a preferred operating mode, the M switched capacitor circuits and the control circuitry cooperate such that each switched capacitor circuit in the group or subset of N switched capacitor circuits deliver a charge substantially equal to $(C/M)(V_{REF}-V_{IN})$ to a virtual ground node of the signal scaling circuit in every clock period. Each switched capacitor circuit in the group or subset of M–N switched capacitor circuits will preferably deliver a charge substantially equal to $(C/M)V_{REF}$ to the virtual ground node in every clock period. As a result, the total charge delivered to the virtual ground node in each clock period substantially approximates $C[V_{REF}-(N/M)V_{IN}]$, the output of the signal scaling circuit including a N/M component of the input signal as desired.

One assumption in the design and discussion of the signal scaling circuit of the present invention concerns the ability to match the capacitance of each of the M switched capacitor circuits. Hence, optimum performance of such a signal scaling circuit may be achieved by minimizing the effects of any capacitive differences. According to teachings of the present invention, the effects of any differences in capacitance between any of the M switched capacitor circuits may be minimized or eliminated by shuffling the switched capacitor circuits.

As implemented in the present invention, shuffling involves varying the population of each of the two subsets of switched capacitor circuits throughout circuit operation. Preferably, switched capacitor circuit shuffling is implemented such that each of the switched capacitor circuits is included in the subset of N switched capacitor circuits a substantially equal number of times. One effect of switched capacitor circuit shuffling is a decrease over time of the average error in the scale factor N/M due to capacitance mismatches. As such, a variety of switched capacitor circuit subset population changes may be implemented to achieve a desired reduction in error for the scale factor N/M. For example, the switched capacitor circuits included in the subset of N switched capacitor circuits may be changed every clock cycle, every two clock cycles, every three clock cycles, etc. An exemplary shuffling implementation will be discussed in greater detail below.

Referring first to FIG. 1, a single-ended embodiment of a switched capacitor N/M signal scaling circuit is shown according to teachings of the present invention. Similar in function to signal scaling circuit 62 of FIG. 3, signal scaling circuit 10 includes three (3) switched capacitor circuits and is operable to effect a 1/3 or 2/3 input signal scaling. Alternative signal scaling ratios N/M may be selected for signal scaling circuits 10 and 62 as well as for other signal scaling circuit embodiments incorporating teachings of the present invention.

In the embodiment of signal scaling circuit 10 illustrated in FIG. 1, the three (3) switched capacitor branches preferably include capacitors 12, 14 and 16. Switched capacitor branches constructed from a plurality of capacitors, one or more capacitors and other circuit components or from a variety of other circuit components may be utilized in accordance with teachings of the present invention.

Capacitor 12 may be selectively coupled to an input signal or voltage source, $V_{IN}$, through switch 18 and to a reference signal or voltage source, $V_{DAC}$, through switch 20. Similarly, capacitor 14 may be selectively coupled to $V_{IN}$ through switch 22 and to $V_{DAC}$ through switch 24. Capacitor 16 may be selectively coupled to $V_{IN}$ through switch 26 and to $V_{DAC}$ through switch 28. Capacitors 12, 14 and 16 may be selectively shorted through switches 30, 32 and 34, respectively. Capacitors 12, 14 and 16 may be selectively coupled to a bias or common mode voltage source, $V_{CM}$, through switch 36.

Preferably included at the output of signal scaling circuit 10 is output circuit 38. Output circuit 38 may be selectively coupled to signal scaling circuit 10 through switch 40. As illustrated in FIG. 1, output circuit 38 may include an operational amplifier 42 and feedback capacitor 44. As oriented in FIG. 1, output circuit 38, with its positive terminal coupled to $V_{CM}$ and its negative terminal coupled to the output of operational amplifier 42 through feedback capacitor 44, is configured to perform as an inverting integrator. Other output circuits may be employed without departing from the spirit and scope of the present invention.

Signal scaling circuit 10 may be controlled by control circuitry 46. Control circuitry 46 preferably uses one or more clock signals associated with the application in which signal scaling circuit 10 is employed to produce the control signals associated with switches 18, 20, 22, 24, 26, 28, 30, 32, 34, 36 and 40. In the embodiment of signal scaling circuit 10 illustrated in FIG. 1, control circuitry 46 preferably produces a series of control signals similar to those illustrated in the timing diagram of FIG. 2.

Referring to FIGS. 1 and 2, signal scaling circuit 10 preferably performs in much the same manner as that described in greater detail below with reference to signal scaling circuit 62 of FIG. 3. During clock phase 48, switches 18, 26, 32 and 36 are preferably closed. As a result, capacitors 12 and 16 may each obtain a charge substantially equal to $C_{12}(V_{IN}-V_{CM})$ and $C_{16}(V_{IN}-V_{CM})$, respectively. Capacitor 14 does not charge due to the short created by the closure of switch 32, and the open condition of switches 22 and 24.

In clock phase 50, switches 20, 24, 28 and 40 are preferably closed. In clock phase 50, capacitors 12 and 16 may deliver a charge substantially equal to $C_n(V_{DAC}-V_{IN})$, where $C_n$ represents the capacitive value of capacitors 12 and 16, for n=12, 16, to output circuit 38 and capacitor 14 will deliver a charge substantially equal to $C_{14}V_{DAC}$. For $C_{12}=C_{14}=C_{16}=C_{Total}/M$, the charge delivered to output circuit 38 is substantially equal to $C_{Total}[V_{DAC}-(2/3)V_{IN}]$, where $C_{Total}$ is the total capacitance of the M switched capacitor circuits and M=3. Through clock phases 52, 54, 56, and 58, capacitors 12, 14 and 16 may perform similar to that described below with respect to signal scaling circuit 62. As will be described in more detail below, the population of the N switched capacitor circuit subset and the M–N switched capacitor circuit subset will preferably be shuffled or varied through each clock cycle such that each switched capacitor circuit may be selected for inclusion in each subset a substantially equal number of times. For example, during clock phase 52 capacitors 12 and 14 are included in the subset of N switched capacitor circuits and capacitor 16 is included in the M–N subset of switched capacitor circuits, while during clock phase 56 capacitors 14 and 16 are included in the N subset of switched capacitor circuits and capacitor 12 is included in the M–N subset of switched capacitor circuits.

Referring now to FIG. 3, an exemplary embodiment of a differential signal scaling circuit incorporating teachings of the present invention is shown. As configured in FIG. 1, scaling circuit 62 provides M=3 switched capacitor circuits and a scaling factor of N/M=2/3. The embodiment of signal scaling circuit 62 illustrated in FIG. 3 employs a differential topology. Alternate topologies may incorporate teachings of the present invention and are therefore considered within the scope and spirit of the present invention. For example, a signal scaling circuit incorporating teachings of the present invention may differentially couple one or more signal sources to the M switched capacitor, may tie one or more signal sources to ground, etc.

As illustrated in FIG. 3, capacitors 64 and 66 form a portion of a first switched capacitor circuit, capacitors 68 and 70 form a portion of a second switched capacitor circuit and capacitors 72 and 74 form a portion of a third switched capacitor circuit, hence M=3. For the implementation shown, N=2. The capacitance of capacitors 64, 66, 68, 70, 72 and 74 is indicated herein as $C_n$, where n=64, 66, 68, 70, 72 and 74, and designates an associated capacitor. As mentioned above, the capacitance of each switched capacitor circuit is preferably substantially equal to C/M, where C is the total capacitance of the M switched capacitor circuits. Depending on the characteristics desired by a circuit designer, alternative implementations of switched capacitor circuits may be employed. For example, components in lieu of or in addition to the individual capacitors illustrated in FIGS. 1 and 3 may be employed in a given design of a circuit.

With respect to the first switched capacitor circuit, capacitors 64 and 66 may be selectively coupled to input signal sources $V_{IN+}$ and $V_{IN-}$ through switches 76 and 78, respectively. Similarly, capacitors 64 and 66 may be selectively coupled to reference signal sources $V_{DAC+}$ and $V_{DAC-}$ through switches 80 and 82, respectively. To enable capacitors 64 and 66 to operate in parallel, switch 84 is preferably provided.

With respect to the second switched capacitor circuit, capacitors 68 and 70 may be selectively coupled to input signal sources $V_{IN+}$ and $V_{IN-}$ through switches 86 and 88, respectively. Similarly, capacitors 68 and 70 may be selectively coupled to reference signal sources $V_{DAC+}$ and $V_{DAC-}$ through switches 90 and 92, respectively. To enable capacitors 68 and 70 to operate in parallel, switch 94 is preferably provided.

With respect to the third switched capacitor circuit, capacitors 72 and 74 may be selectively coupled to input signal sources $V_{IN+}$ and $V_{IN-}$ through switches 96 and 98, respectively. Similarly, capacitors 72 and 74 may be selectively coupled to reference signal sources $V_{DAC+}$ and $V_{DAC-}$ through switches 100 and 102, respectively. To enable capacitors 72 and 74 to operate in parallel, switch 104 is preferably provided.

As illustrated in FIG. 3, one embodiment of signal scaling circuit 62 is preferably operable to receive signals from a variety of signal sources. Input signal $V_{IN}$, including components $V_{IN+}$ and $V_{IN-}$, typically represents the signal to be sampled, scaled and converted into a preferred form. The type or format for input signal $V_{IN}$ may vary and often depends, at least to some extent, on the application in which signal scaling circuit 62 is used.

A reference signal, $V_{DAC}$ herein and including components $V_{DAC+}$ and $V_{DAC-}$, is also preferably used in the signal scaling performed by signal scaling circuit 62. The reference signal may be supplied by a signal source external to the application or device in which signal scaling circuit 62 is employed. Alternatively, for example in a delta-sigma modulator, the reference signal may be supplied by an internal signal source such as a DAC (digital-to-analog converter).

A bias or common mode voltage $V_{CM}$ is also preferably utilized by signal scaling circuit 62. A bias voltage or $V_{CM}$ may be provided to aid in the charging and discharging of capacitors 64, 66, 68, 70, 72 and 74. In one embodiment, a bias voltage source tied to the individual capacitors and to ground may be supplied. Alternatively, as illustrated in FIG. 3, a common mode voltage or $V_{CM}$ may be provided which includes a voltage value acting as an offset for the charging and discharging of selected capacitors. As illustrated in FIG. 3, the bias voltage source or $V_{CM}$ may be selectively coupled to capacitors 64, 68 and 72 through switch 106 and to capacitors 66, 70 and 74 through switch 108. Switch 110 may also be provided in signal scaling circuit 62 to selectively couple capacitors 64, 66, 68, 70, 72 and 74 together as well as to a bias voltage source or $V_{CM}$.

Output circuit 112 is shown and may be selectively coupled to the M switched capacitor circuits through switches 114 and 116. Output circuit 112 may be described as a differential inverting integrator. Output circuit 112 preferably includes operational amplifier 118 and feedback capacitors 120 and 122. Alternative embodiments of output circuit 112 may be employed at an output node of a signal scaling circuit 62 incorporating teachings of the present invention.

To effect the desired operation of signal scaling circuit 62, state machine or control circuitry 124 is also preferably provided. Control circuitry 124 may use a clock signal from its operating environment, such as a clock signal originating in an associated delta-sigma modulator, to enable switch controls $\Phi_1$, $\Phi_2$, $\Phi_{1A}$, $\Phi_{1B}$, and $\Phi_{1C}$ to be generated. The relationship between $\Phi_1$, $\Phi_2$, $\Phi_{1A}$, $\Phi_{1B}$ and $\Phi_{1C}$ is generally illustrated in the timing diagram of FIG. 2. Alternatively, an implementation may be devised in which a clock signal internal to control circuitry 124 is used to generate switch controls $\Phi_1$, $\Phi_2$, $\Phi_{1A}$, $\Phi_{1B}$ and $\Phi_{1C}$. In either event, control circuitry 124 may be implemented using a variety of technologies.

Referring to FIGS. 2 and 3, one operational implementation of signal scaling circuit 62 may be understood. Beginning at clock phase 48 of FIG. 2, control signals $\Phi_1$ and $\Phi_{1A}$ are high and control signals $\Phi_2$, $\Phi_{1B}$ and $\Phi_{1C}$ are low. In response, switches 76, 78, 96, 98, 94, 106, 108 and 110 are closed while remaining switches 80, 82, 84, 86, 88, 90, 92, 100, 102, 104, 114 and 116 remain open. As a result of these switch orientations, capacitors 64 and 72 may be charged to a value substantially equal to $V_{IN+} - V_{CM}$ and capacitors 66 and 74 may be charged to a value substantially equal to $V_{IN-} - V_{CM}$. Further, capacitors 68 and 70 are maintained in parallel, causing the voltage across them to be substantially equal to the difference between the common mode voltage of $V_{IN}$ and $V_{CM}$, assumed herein to be zero (0).

During the next clock phase 50, $\Phi_2$ is high while control signals $\Phi_1$, $\Phi_{1A}$, $\Phi_{1B}$ and $\Phi_{1C}$ are low. In response, $V_{DAC+}$ is selectively coupled to capacitors 64, 68 and 72 through switches 80, 90 and 100, respectively. Similarly, $V_{DAC-}$ is selectively coupled to capacitors 66, 70 and 74 through switches 82, 92 and 102, respectively. Also during phase 50, output circuit 112 is selectively coupled to capacitors 64, 66, 68, 70, 72 and 74 through switches 114 and 116. From the application of $V_{DAC+}$ in phase 50, capacitors 64 and 72 are caused to deliver a charge substantially equal to $(C_{64}+C_{72})(V_{DAC+}-V_{IN+})$ to output node 126. Likewise, capacitors 66 and 74 are caused to deliver a charge substantially equal to $(C_{66}+C_{74})(V_{DAC-}-V_{IN-})$ to output node 128. Substantially concurrently, capacitor 68 is caused to deliver a charge substantially equal to $C_{68}V_{DAC+}$ to output node 126 and capacitor 70 is caused to deliver a charge substantially equal to $C_{70}V_{DAC-}$ to output node 128. Thus, for $$C_{64}=C_{68}=C_{72}=C/3 \qquad \text{Equation (1)}$$

the total charge delivered to output node 126 during the first clock cycle of $\Phi_1$ is substantially equal to $C[V_{DAC+}-(2/3)V_{IN+}]$ and the total charge delivered to output node 128 is substantially equal to $C[V_{DAC-}-(2/3)V_{IN-}]$. Thereby, the desired reduction in $V_{IN}$, scaling by the factor N/M, is achieved so long as Equation (1) holds.

In the next two clock phases, 52 and 54, the capacitors in the population of the subset of N switched capacitor circuits includes capacitors 64, 66, 68 and 70. The capacitors populating the M–N subset are capacitors 72 and 74. The signal values communicated to output circuit 112 are substantially the same as those described above for $C_{64}=C_{66}=C_{68}=\ldots=C_{74}$. Likewise, in clock phases 56 and 58, the capacitors in the population of the subset of N switched capacitor circuits includes capacitors 68, 70, 72 and 74. The capacitors populating the M–N subset are capacitors 64 and 66. The signal values communicated to output circuit 112 are again substantially the same as those described above for $C_{64}=C_{66}=C_{68}=\ldots=C_{74}$. In clock phase 60, capacitors 64, 66, 72 and 74 are again included in the population of the N subset of switched capacitor circuits and the switch reaction, charge delivery, etc., is again as that described with respect to clock phase 48.

In the description above, the concept of shuffling as taught by the present invention is discussed. As mentioned above with respect to clock phase 48, the capacitors populating the N subset of switched capacitor circuits includes capacitors 64, 66, 72 and 74. Hence, the capacitors populating the M–N subset of switched capacitor circuits includes capacitors 68 and 70. In clock phase 52, the capacitors populating the N subset of switched capacitor circuits were or have been shuffled to include capacitors 64, 66, 68 and 70. The capacitors populating the M–N subset of switched capacitor circuits during clock phase 52 were or have been shuffled to include capacitors 72 and 74. Similarly, in clock phase 56, the capacitors populating the N subset of switched capacitor circuits were or have been shuffled to include capacitors 68, 70, 72 and 74. The capacitors populating the M–N subset of switched capacitor circuits during clock phase 56 were or have been shuffled to include capacitors 64 and 66. Over time, depending upon on which clock phase sampling is ended, each of capacitors 64, 66, 68, 70, 72 and 74 may be included in the population of each subset a substantially equal number of times. As discussed below, shuffling capacitor populations enables the effects of component differences to be minimized as well as produces other benefits.

In reality, Equation (1) will not hold exactly, i.e., $C_{64} \neq C_{66} \neq C_{68} \neq \ldots \neq C_{74}$. As a result, the charge Q delivered to output node 126 during clock phase $\Phi_{2i}$, where i=64, 68 or 72, $C_+=C_{64}+C_{68}+C_{72}$; and $e_i$ is the relative error $[C_{64}+C_{68}-(2/3)C_+]/C_+$, etc., will equal:

$$Q_{2i+}=C_+[V_{DAC+}-(2/3+e_i)V_{IN+}] \qquad \text{Equation (2)}$$

A similar expression gives the charge $Q_{2i-}$ delivered to output node 128 during the same clock phase. Consequently, charges delivered during each clock cycle will be inaccurate. However, the sum of the errors $e_i$ made during six (6) consecutive clock phases, e.g., 48, 50, 52, 54, 56 and 58, substantially satisfies:

$$e_{64}+e_{68}+e_{72}=0 \qquad \text{Equation (3)}$$

Hence, the average error is substantially equal to zero (0). Further, errors $e_i$ typically only introduce a modulation of $V_{IN}$ with a carrier frequency $Df_s/3$. Usually, D>>1, and hence the resulting spectral lobes around $Df_s/3$, $2Df_s/3$, etc., are harmless. For an embodiment of the signal scaling circuit including M switched capacitor circuits, the introduced modulation has a carrier frequency $Df_s/M$. Note that asymmetries between the positive and negative sides of the circuit may introduce additional errors, which may be removed by more complex switching schemes.

The invention, therefore, is well adapted to carry out the objects and attain the ends and advantages mentioned, as well as others inherent therein. While the invention has been depicted, described, and is defined by reference to exemplary embodiments of the invention, such references do not imply a limitation on the invention, and no such limitation is to be inferred. The invention may be capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A signal scaling circuit, comprising:
   first, second and third capacitors connected to a first node;
   a first switch connected between the first capacitor and a signal input;
   a second switch connected between the first capacitor and a reference voltage;
   a third switch connected between the second capacitor and the input signal;
   a fourth switch connected between the second capacitor and the reference voltage;
   a fifth switch connected between the third capacitor and the input signal;
   a sixth switch connected between the third capacitor and the reference voltage;
   a seventh switch connected in parallel with the first capacitor;
   an eighth switch connected in parallel with the second capacitor;
   a ninth switch connected in parallel with the third capacitor;
   a tenth switch connected between a common mode voltage source and the first node;
   an eleventh switch connected between the first node and an output of the signal scaling circuit; and
   a switch controller for controlling the first through eleventh switches, wherein the switch controller controls opening and closing appropriate ones of the first through eleventh switches so that the output of the signal scaling circuit has a second signal amplitude that is scaled to one-third or two-thirds of a first signal amplitude at the signal input.

2. The signal scaling circuit according to claim 1, further comprising the switch controller shuffling the first, second and third capacitors for reducing error in the one-third or two-thirds amplitude scaling caused by any mismatch of capacitance values of the first, second and third capacitors.

3. A signal scaling circuit, comprising:
   M capacitors connected to a first node;
   a plurality of first switches, each of the plurality of first switches being connected between a respective one of the M capacitors and a signal input;
   a plurality of second switches, each of the plurality of second switches being connected between the respective one of the M capacitors and a reference voltage;
   a plurality of third switches, each of the plurality of third switches being connected in parallel with the respective one of the M capacitors;
   a fourth switch connected between the first node and a common mode voltage source; and
   a switch controller, wherein the switch controller controls opening and closing the fourth switch and appropriate ones of the plurality of first, second and third switches so that the first node has a second signal whose amplitude is scaled by N/M of the amplitude of a first signal at the signal input, where N is less than M, and M and N are positive integer numbers.

4. The signal scaling circuit according to claim 3, further comprising a fifth switch connected between the first node and an output of the signal scaling circuit, wherein the switch controller controls opening and closing of the fifth switch in combination with controlling the opening and closing of the fourth switch and the plurality of first, second and third switches.

5. The signal scaling circuit according to claim 4, further comprising an operational amplifier having an input coupled to the output of the signal scaling circuit.

6. The signal scaling circuit according to claim 5, wherein the operational amplifier is configured to be an inverting integrator.

7. The signal scaling circuit according to claim 3, further comprising the switch controller shuffling the M capacitors for reducing error in the N/M scaling caused by any mismatch of capacitance values of the M capacitors.

8. A differential signal scaling circuit, comprising:
   M positive capacitors connected to a positive node;
   a plurality of first positive switches, each of the plurality of first positive switches being connected between a respective one of the M positive capacitors and a positive signal input;
   a plurality of second positive switches, each of the plurality of second positive switches being connected between the respective one of the M positive capacitors and a positive reference voltage;
   a third switch connected between the positive node and a common mode voltage source;
   M negative capacitors connected to a negative node;
   a plurality of first negative switches, each of the plurality of first negative switches being connected between the respective one of the M negative capacitors and a negative signal input;
   a plurality of second negative switches, each of the plurality of second negative switches being connected between a respective one of the M negative capacitors and a negative reference voltage;
   a fourth switch connected between the negative node and the common mode voltage source;
   a plurality of fifth switches, each of the plurality of fifth switches being connected between the respective ones of the M positive and M negative capacitors;
   a sixth switch connected between the positive and negative nodes; and
   a switch controller, wherein the switch controller controls opening and closing the third, fourth and sixth switches, appropriate ones of the plurality of first and second positive and negative switches, and appropriate ones of the plurality of fifth switches so that the positive node has a second positive signal that is N/M the amplitude of a first positive signal at the positive signal input and the negative node has a second negative signal that is N/M the amplitude of a first negative signal at the negative signal input, where N is less than M, and M and N are positive integer numbers.

9. The differential signal scaling circuit according to claim 8, further comprising seventh positive and negative switches connected between the positive and negative nodes and positive and negative outputs, respectively, of the signal scaling circuit, wherein the switch controller controls opening and closing of the seventh positive and negative switches in combination with controlling the opening and closing of the third, fourth and sixth switches, appropriate ones of the plurality of first and second positive and negative switches, and appropriate ones of the plurality of fifth switches.

10. The differential signal scaling circuit according to claim 9, further comprising a differential operational amplifier having positive and negative inputs coupled to the positive and negative outputs of the signal scaling circuit.

11. The differential signal scaling circuit according to claim 10, wherein the differential operational amplifier is configured to be an inverting integrator.

12. The differential signal scaling circuit according to 8, further comprising the switch controller shuffling the M positive capacitors and shuffling the M negative capacitors for reducing error in the N/M scaling caused by any mismatch of capacitance values of the M positive capacitors, and any mismatch of capacitance values of the M negative capacitors.

* * * * *